(12) United States Patent
Adelmann

(10) Patent No.: US 7,098,541 B2
(45) Date of Patent: Aug. 29, 2006

(54) INTERCONNECT METHOD FOR DIRECTLY CONNECTED STACKED INTEGRATED CIRCUITS

(75) Inventor: Todd C. Adelmann, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/440,815

(22) Filed: May 19, 2003

(65) Prior Publication Data

US 2004/0232559 A1 Nov. 25, 2004

(51) Int. Cl.
  *H01L 23/528* (2006.01)
(52) U.S. Cl. ............... 257/777; 257/778; 257/E23.169; 257/E23.175; 438/108
(58) Field of Classification Search ................ 257/686, 257/777, 778, 786, E23.151, E23.07, E23.141, 257/E23.169, E23.175, E21.499, E21.513; 438/107–109; 361/729, 735, 783
See application file for complete search history.

(56) References Cited

U.S. PATENT DOCUMENTS

| 5,165,067 | A | 11/1992 | Wakefield et al. |
| 5,490,041 | A | 2/1996 | Furukawa et al. |
| 5,568,356 | A | 10/1996 | Schwartz |
| 5,677,567 | A | 10/1997 | Ma et al. |
| 6,051,886 | A | 4/2000 | Fogal et al. |
| 6,376,914 | B1 | 4/2002 | Kovats et al. |
| 6,445,063 | B1 * | 9/2002 | King et al. .................. 257/686 |
| 6,458,623 | B1 * | 10/2002 | Goldmann et al. ......... 438/107 |
| 6,462,422 | B1 | 10/2002 | Huang |
| 2002/0079591 | A1 * | 6/2002 | Sakiyama et al. .......... 257/777 |
| 2003/0085469 | A1 | 5/2003 | Yamada et al. |
| 2004/0217468 | A1 | 11/2004 | Imaoka |
| 2005/0090042 | A1 * | 4/2005 | Swan et al. .................. 438/107 |

FOREIGN PATENT DOCUMENTS

| JP | 60001856 A | 7/1985 |
| JP | 2003037242 A | 7/2003 |

OTHER PUBLICATIONS

United Kingdom Patent Office Search Report dated Sep. 28, 2004, 3 pp.

\* cited by examiner

*Primary Examiner*—Kenneth Parker
*Assistant Examiner*—Matthew C. Landau

(57) ABSTRACT

A method and related configuration for stacking and interconnecting multiple identical integrated circuit semiconductor die. A die designed in accordance with the present invention can be directly interconnected with other identical die by placing a second die on a first die. The second die is substantially identical to the first die and has a rotation with respect to the first die. A plurality of electrical interconnections on the first die are contacted with a plurality of electrical interconnections on the second die, forming electrical interconnects between adjacent stacked dies.

17 Claims, 5 Drawing Sheets

INTERCONNECT METHOD FOR DIRECTLY CONNECTED STACKED INTEGRATED CIRCUITS

BACKGROUND

Modern-day semiconductor devices, commonly called integrated circuits, or "dies," are fabricated on wafers, and the wafers are then sawn into grids, separating the individual dies prior to assembly in a package. Integrated circuits are fabricated in a variety of sizes, but typically range from only a few millimeters to a couple of centimeters or more in width. Each die may have numerous electrical signals for input or output. Processors, for example, may have several hundred signals.

Provisions must be made to electrically connect a die to the printed circuit board with which it is used and also to protect the die from damage or other external conditions that could hinder its operation. Package engineering, or packaging, is the field within semiconductor engineering that addresses these needs. Integrated circuits are generally mounted on printed circuit boards in "packages," i.e., structures that provide an electrical interface with a printed circuit board (or simply "board") and also protect a bare die and its electrical interconnects from damage, including damage due to moisture, vibration, and impact. A packaged die is generally attached to a metal leadframe or a substrate, electrically connected to the leadframe or substrate, and encapsulated with a ceramic enclosure or plastic "mold compound" for protection.

Occasionally, conventional packaging solutions may not afford adequate space savings on a printed circuit board. Especially in the case of memory devices, the functionality of multiple dies may be required while space for only one packaged die is available on a board. In such cases, using a "multi-chip module" (MCM), or single package containing multiple dies, is often considered. In some MCM's, dies are arranged side-by-side on a single substrate. However, depending on the application, this approach may not provide significant space savings over simply packaging multiple dies separately, a more common assembly process. Accordingly, it may be desired to stack multiple dies within a single package.

There are several benefits to stacked die packages. More functionality within a given area of board space may be achieved, since more silicon functions per area of board space (and per unit volume of application space) are possible. Eliminating individual packages for each die can contribute to significant size and weight reductions of printed circuit boards and electronic devices in which they are installed. Including two or more dies in one package decreases the number of components mounted on an application board, potentially reducing overall system cost. In addition, providing a single package for package assembly, electrical testing and handling may reduce manufacturing costs.

In some cases, it is desirable to package multiple identical dies in a single package, such as in the case of certain memory devices. As an example, four identical 8-megabyte (Mb) dies could be interconnected to act as a single 32-Mb device. In addition, a 16- or 24-Mb device could be assembled on the same package substrate or board by interconnecting two or three of these dies, respectively, without the need for designing and fabricating an additional die design.

Stacking and electrically interconnecting several identical dies has proved problematic, since each identical die will have the exact same internal structures, circuitry, and pattern of bond pads. Consequently, it is difficult to route multiple identical dies to a substrate or motherboard through those dies below it, since an active feature on one die would require an area free of active circuitry on the die beneath it in order to pass through and connect with the substrate or board. A need exists to provide a low-profile solution for interconnecting multiple identical stacked dies.

BRIEF SUMMARY

Disclosed is a method and system for interconnecting an integrated circuit die including a surface having an integrated circuit and a plurality of bond pad sets, with each bond pad set having substantially identical pad layouts on the die surface. A die designed in accordance with the present invention can be directly interconnected with other identical die by placing a second die on a first die. The second die is substantially identical to the first die and has a rotation with respect to the first die. A plurality of electrical interconnections on the first die are contacted with a plurality of electrical interconnections on the second die, forming electrical interconnects between adjacent stacked dies.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, semiconductor companies may refer to processes, components, and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . . "

The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "die"

("dies" for plural) refers generically to a semiconductor microchip, in various stages of completion, whether integral to a wafer or singulated from a semiconductor wafer and including an integrated circuit fabricated on its surface. The term "wafer" refers to a generally round, single-crystal semiconductor substrate upon which integrated circuits are fabricated in the form of dies.

The term "interconnect" refers to a physical connection providing possible electrical communication between the connected items. The term "bond pad" refers generically to a conductive site used for routing signals or other electrical connections to or from a die, and may apply to sites for use with wirebond, C4 ball attach or other interconnect methods. It will be understood that, when the term "side" is used in the context of bond pads, a "side" refers to a periphery area on a top or bottom surface of a die closest to a particular die edge face. The term "pin" refers to the terminating point on a die surface of an electrical connection (such as a signal address, power, ground or no connect) and generally corresponds to a specific bond pad. The term "land" refers to a conductive interconnection site on a package substrate or printed circuit board. To the extent that any term is not specially defined in this specification, the intent is that the term is to be given its plain and ordinary meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
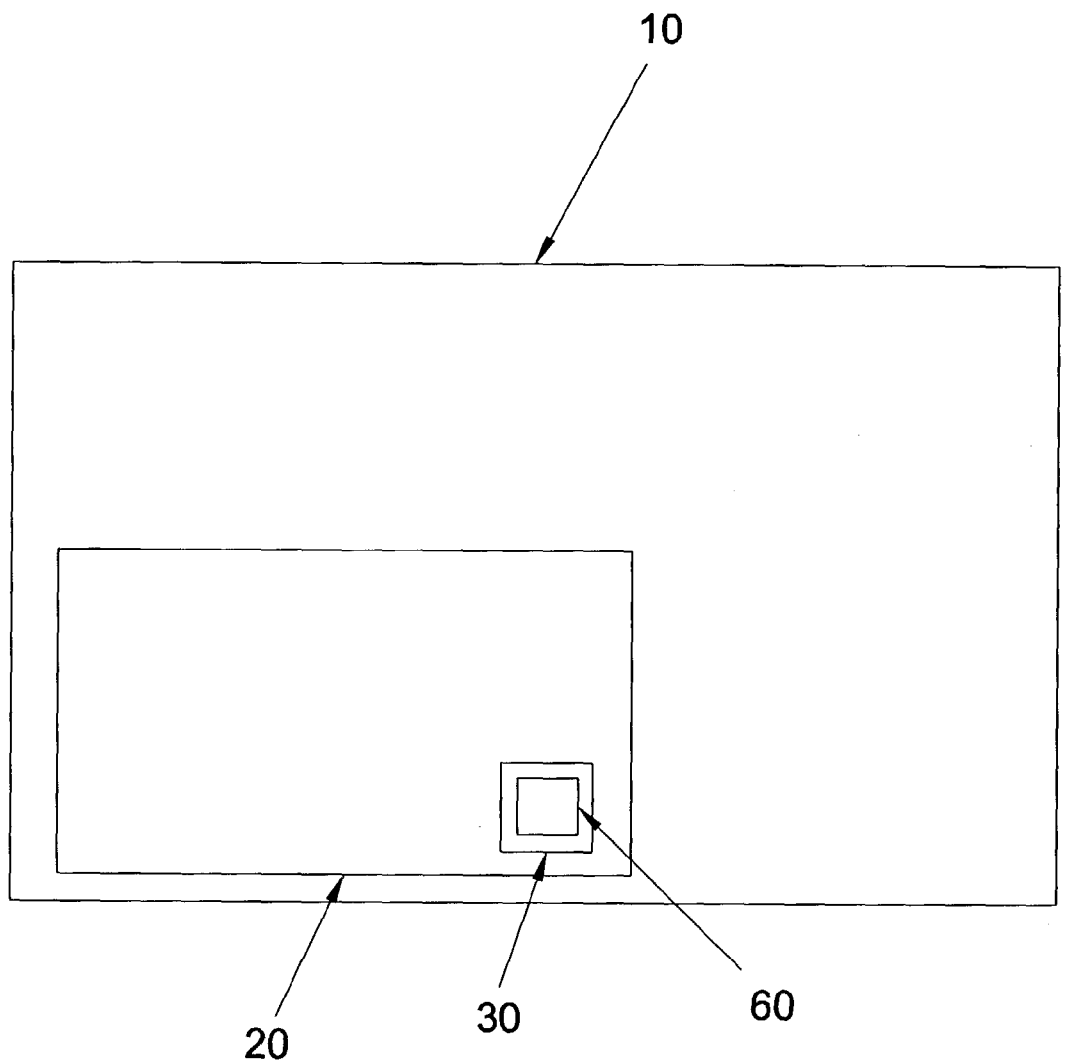
FIG. 1 shows a system-level schematic of an electronic device.

In accordance with the present invention, a method and system are disclosed for interconnecting multiple identical stacked semiconductor dies. Referring now to FIG. 1, a system-level schematic is shown of an electronic device 10 incorporating dies 60 stacked in accordance with the preferred embodiments. An electronic device 10 typically includes one or more printed circuit boards 20 to which a plurality of packages 30 are interconnected. The electronic device 10 may be a computer, mobile telephone or any typical electronic device incorporating a printed circuit board 20. Within a package 30, a plurality of identical dies 60 are stacked and interconnected to the package. Alternatively, the package 30 may be absent, and the lowermost of the stacked dies 60 may be interconnected directly to the board 20. Dies 60 typically process input and/or provide information for operation of the electronic device 10.

Figure 2A:
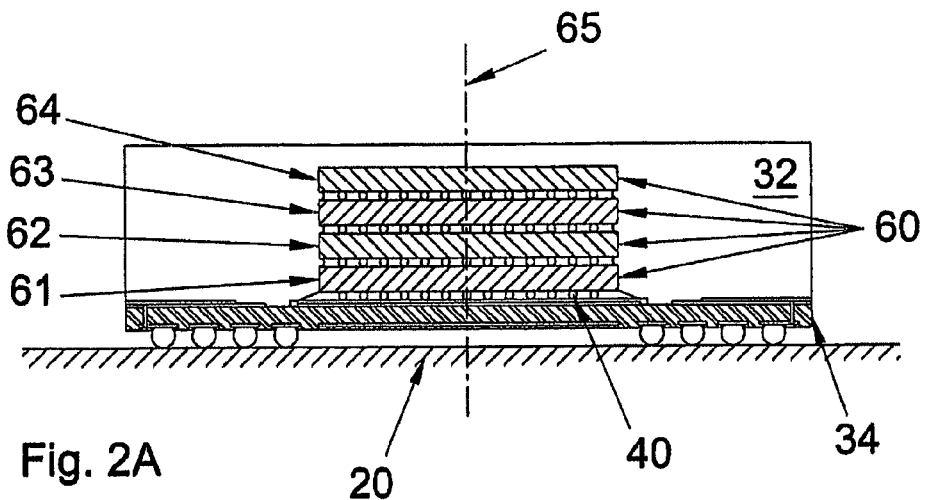
FIG. 2A shows a cross-sectional view of a first embodiment of the present invention, with a package containing four identical stacked dies.

A first embodiment of the present invention is shown in FIG. 2A, wherein four identical stacked dies 60 are packaged on a substrate 34 and covered with an encapsulant 32. For the purposes of this disclosure, the stacked dies 60 are assumed to be identical and are distinguished by position, from bottom to top, with reference numerals 61, 62, 63 and 64, respectively. In the embodiment shown, the identical dies 61, 62, 63 and 64 are all rotated 90 degrees from one another, about an axis 65 perpendicular to the die surfaces and passing vertically through the geometric center of the dies.

A die typically includes integrated circuits with output pads, or "bond" pads (not shown), on at least one surface of the die. For die designed in accordance with the present invention, both the top and bottom faces of a die have matching patterns of bond pads, with each pair of matching bond pads linked by connections passing from the top face to the bottom face. The die is designed to be usable in various rotational positions relative to the substrate 34. In the following description, the number of rotational positions is assumed to equal four.

It will be understood that, while four dies 60 are shown, more or fewer dies could be assembled in this manner without departing from the spirit of the invention. It will also be understood that the dies will be described as having bumped interconnections 40 with one another, but can have any suitable method for direct interconnection in accordance with the representative embodiments. It will also be understood that the dies may be interconnected to a printed circuit board or packaging solution other than a substrate.

Figure 2B:
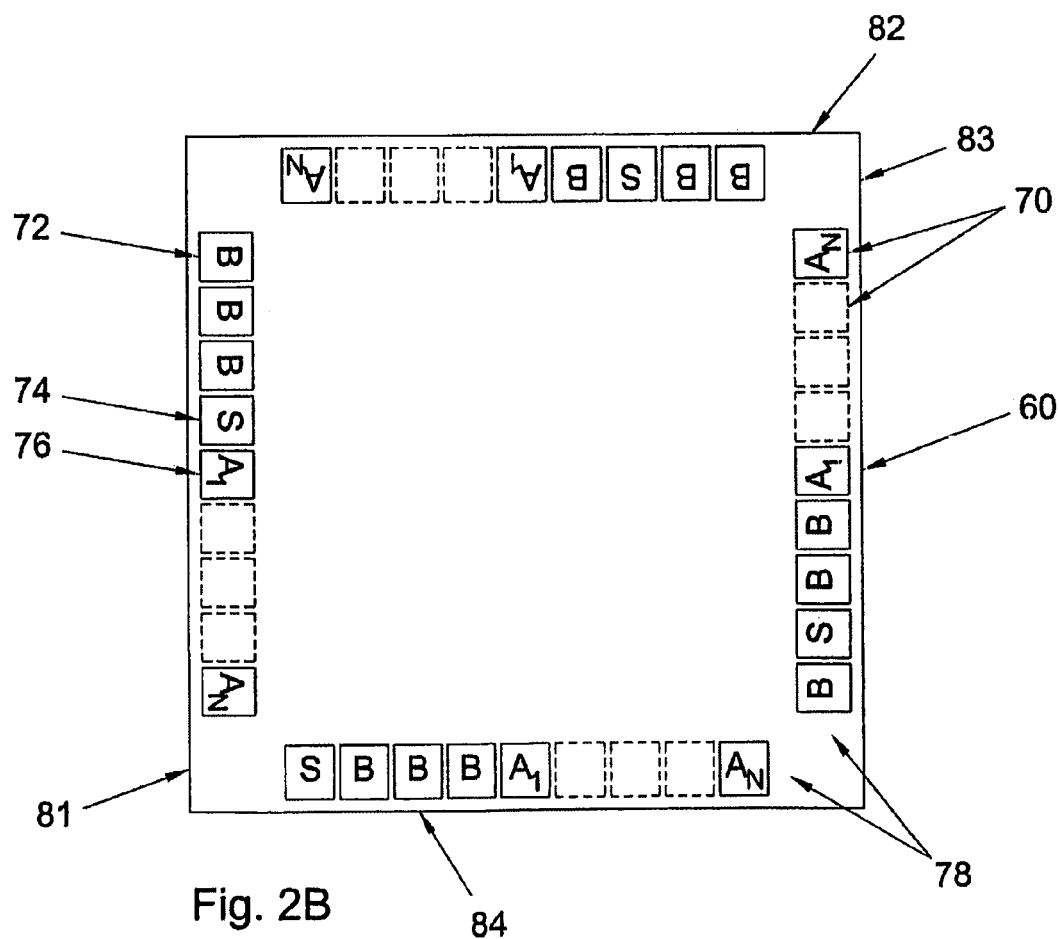
FIG. 2B shows a top view of a die design in accordance with a representative embodiment.

A die designed in accordance with various embodiments may have pads along all four sides of the die surface, with each side having a different set of pins assigned to the bond pads (see FIG. 2B). When used in the context of die orientation, the term "side" refers generically to a periphery area of a die, whether an end face or surface area near such an end face. In a configuration having four identical, stacked dies, each of the four sides on each die will have a different pad assignment order. However, it will be understood that each die will have the same pad layout, such that the spacings between and locations of bond pads on each side will be identical on each of the four sides. When the dies are assembled according to certain embodiments, only one side is used per die for routing all signals.

Each die is designed for electrical interconnection with other identical stacked dies. The pad layout may be chosen so that certain pads exist in each set, and other pads operate to distinguish each set. Distinguishing pads do not have to be "select" lines, but may alternatively be "address" lines with four different logic masks. Electrical interconnections between two dies are formed so one set of pads from each die is in electrical communication with the other dies. As an example, if four dies are to be interconnected, and each die represents one megabyte (Mb) of memory, pad locations for data signals and address signals may be in each set. Essentially, on each side of the die, a particular address signal pad has the same location on every side of the die, no matter how the die is rotated.

The embodiments of the present invention do not require connecting multiple unique dies, but allow direct interconnection of more than one of the same dies, rotated from the die layered with it. The rotation between adjacent dies is determined by the symmetry, and for a four-fold symmetry, the rotation may be some multiple of 90 degrees. In addition to four-way rotational symmetry, other potentially useful symmetries include two-way, three-way and six-way symmetries. Accordingly, rotations may correspond to integer multiples other than 90°, including 45°, 60°, 120° and 180°.

Many semiconductor devices are "pad limited," meaning all available space in on the perimeter of a die surface is used for bond pads. On memory devices, however, all bond pads could frequently be placed on one side of the perimeter, leaving the other three sides free for repeating the pads in a matching pattern. This configuration allows more than one of the same die to be stacked, when rotated, in accordance with the described embodiments.

Dies designed according to the interconnect method of various embodiments are specially designed having conductive pathways, or vias (not shown), passing through a die between electrical connections on top and bottom surfaces of the die. These electrical interconnections may be conductive "bond" pads upon which a conductive ball, or "bump," is deposited for connecting the surface of one die to the surface of another. Each bond pad is typically associated with a certain signal or other pin (such as a power, ground, or no connect) within the die.

A representative embodiment is shown in FIG. 2B, in which a top view of a die 60 is shown having bond pads 70 arranged into sets 78, with each set 78 having an operational relationship to the integrated circuit of the die that is unique to the particular set. Each set 78 includes one or more bond pads 70, with each bond pad having an operational relationship to the integrated circuit that is operationally indistinguishable to a corresponding bond pad in another bond pad set. Each set 78 is coupled to the integrated circuit by an address range unique to the set.

Each bond pad 70 is typically associated with a pin, with a portion of the pins labeled as "B" for blanks 72, "S" for select lines 74, and "$A_X$" (where $A_X$ represents successive address pins from $A_1$ to $A_N$) for address lines 76. The address pins on each die side are collectively referred to as an "address/data bus," in which the address and data pins may be multiplexed. Blank pads 72 are simply placeholders within a pad configuration, serving as unused spaces through which vias and other lines may vertically pass to adjacent dies, and may not require electrical connection to internal circuitry within the die. Select lines 74 determine which of the multiple die is currently being addressed, and consequently, which of the multiple dies has control of the address/data bus. Collectively, blank pads 72 and select lines 74 within a set 78 are referred to as "selection bond pads." Typically, only one select signal is active at a single time. On each die side, the assignment of select pads and blank pads are varied to allow the rotated, identical die to be used in accordance with the present invention.

In an exemplary implementation, address/data lines $A_{(N+1)}$ and $A_{(N+2)}$ from the host computer/microprocessor (not shown) would be decoded to provide individual addressing lines that would be connected to the select lines on pads 61–64. This would allow the four dies to each cover a different address space and be selected (enabled) only at the appropriate time. For example, there may be 16 address/data lines, $A_1$ through $A_{16}$. That means each die would have 64 K addressable bytes. Two additional address lines, $A_{17}$ and $A_{18}$, for example, would be routed to the select lines such that die 61 is enabled for accesses in the range 0–64 KB, die 62 in the range 64–128 KB, die 63 in the range 128 K–192 KB and die 64 in the range 192–256 KB.

In this first embodiment of the present invention, each of the four dies 60 have internal circuitry connected to one of the select lines. When the appropriate select line is asserted, the die responds to the address signals and may store or provide data on data signal lines (not shown). Address lines 76 respond and return data. It will be understood that, in addition to the pin types illustrated herein, power, ground, and other control lines may be present on the die. As an example, between layered address lines 76 on four stacked dies, all four aligned address positions are connected and active at the same time. Select pins vary locations on each side of a die, such that, when aligned with adjacent stacked dies in accordance with the present invention, die pins above or below the certain select position will be blank pins. Address pins have the same location on each side of a die, such that A1 on one die will be aligned with A1 on an adjacent die, no matter the rotational orientation of the adjacent die.

Figure 2C:
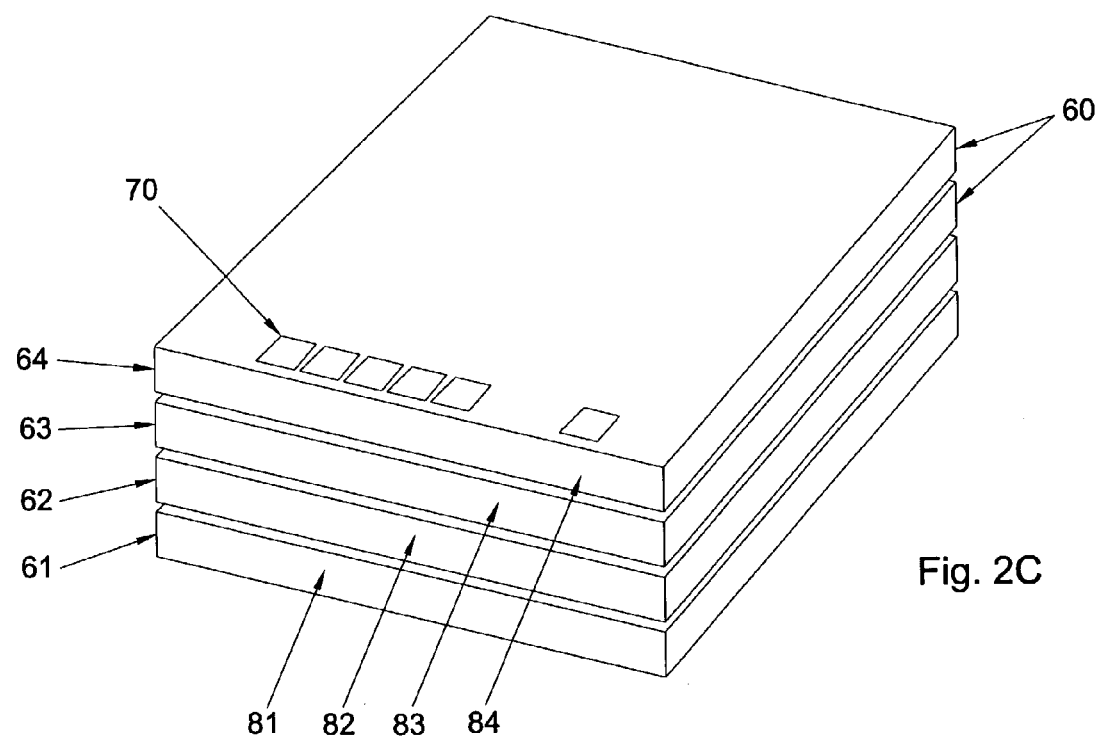
FIG. 2C shows a perspective view of four stacked dies in accordance with a representative embodiment.

The first embodiment of the present invention is illustrated more clearly in the perspective view of FIG. 2C, where four identical dies 60 are stacked and electrically interconnected with one another. In this embodiment, die 60 has a particular pattern and spacing of bond pads 70, which may follow a conventional "bond ring" design, wherein pads are laid out on the die surface, near the perimeter of the die 60. Each side (81, 82, 83, 84, respectively) of die 60 has a unique order of pin assignments, such that when each subsequent die is rotated 90 degrees and stacked on top of the previous die, the physical bond pads are repeated in the same pattern, but the pins assigned to each pad are often varied, depending on pin type, in order to allow electrical interconnection through all stacked dies. Again, it will be understood that, while four dies are shown as an example, more or fewer dies may be assembled in accordance with the representative embodiments without departing from the spirit of the invention.

As with FIG. 2A, for the purposes of differentiation, the identical stacked dies 60 shown in FIG. 2C are labeled from bottom to top as 61, 62, 63 and 64. Each die 60 generally has four sides 81, 82, 83 and 84, rotating a die by 90 degrees will present a different side in a side view. When four identical dies 60 are interconnected together, four unique end faces are preferably lined up with those above and below it. If more than four dies are interconnected, a die end face may be repeated on a face of the stack, as necessary to achieve the required routing.

Figure 2D:
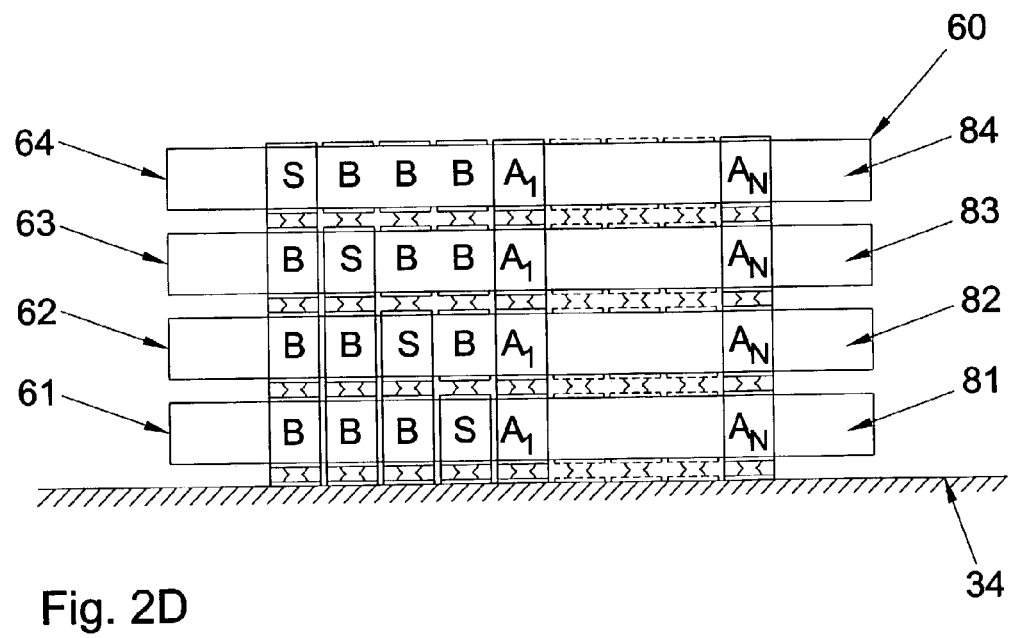
FIG. 2D shows a cross-sectional view of four stacked dies in accordance with a representative embodiment.

In a cross-sectional view of a first embodiment of the present invention, as shown in FIG. 2D, identical dies 61, 62, 63 and 64 are stacked with end faces 81, 82, 83 and 84 lining up, respectively. When a chip select 74 is to be activated on die 64, this signal can be communicated from a device (not shown) on substrate 34 and pass up through blanks 72 on the three dies 60 below die 64. When a chip select 74 is to be activated on die 63, this signal can be communicated from substrate 34 and pass through blanks 72 on the two dies 60 below die 64. When a chip select 74 is to be activated on die 62, this signal can be communicated from a device (not shown) on substrate 34 and pass through blanks 72 on the single die 60 below die 64. When a chip select 74 is to be activated on die 61, this signal can be passed directly from the substrate 34. When any of the addresses 76 (from address $A_1$ to address $A_N$) are active, all four layered address locations are active at the same time, such that when $A_1$ is active on die 64, A1 is also active on dies 61, 62 and 63 as well.

Figure 3A:
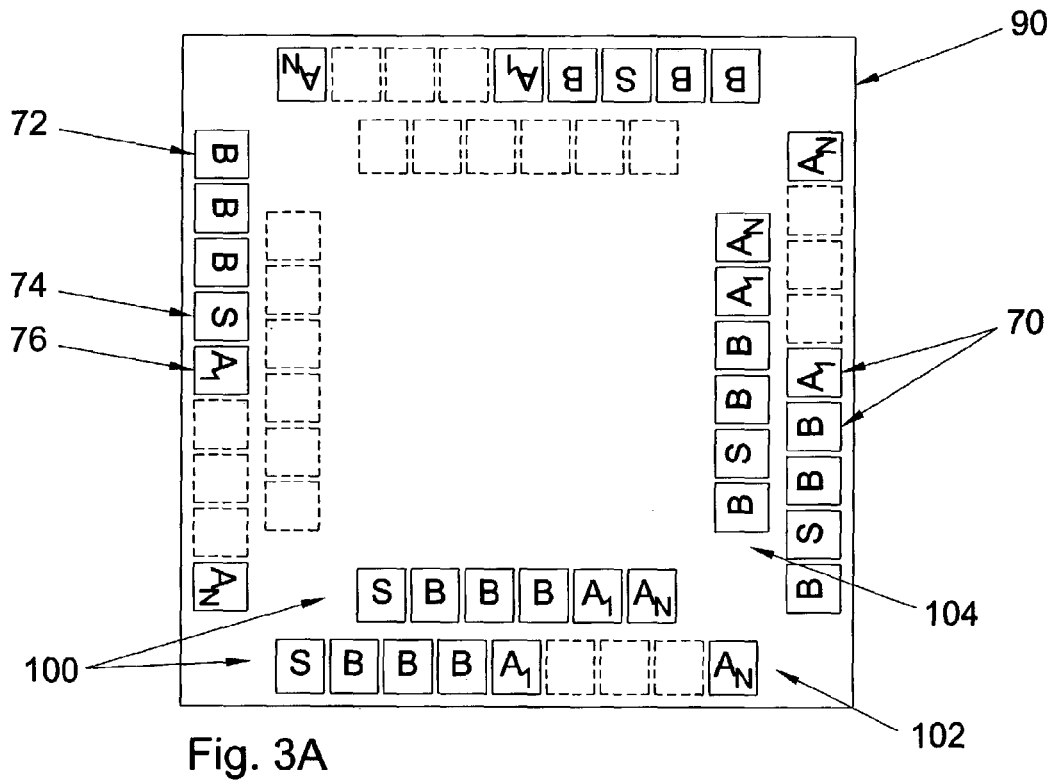
FIG. 3A shows a top view of an alternative embodiment of a die design for stacking more than four dies.

Generally, the number of dies stacked will correspond to the number of sides per die used for interconnection. However more than one bond pad ring may be present on each side of a die, allowing more than four dies to be stacked and interconnected. As shown in a top view in FIG. 3A, an alternative embodiment of the present invention features more than one set 100 of bond pads 70 per die side, there generally being one set 90 of bond pads on a die surface per die 90 to be stacked. It will be understood that, while such sets have been shown in FIG. 3A as linearly arranged rings of bond pads 70 near the die periphery, the bond pads may conform to any pattern on the die surface, linear or otherwise, as long as this pattern is repeated as the die 90 is rotated in 90-degree increments.

Figure 3B:
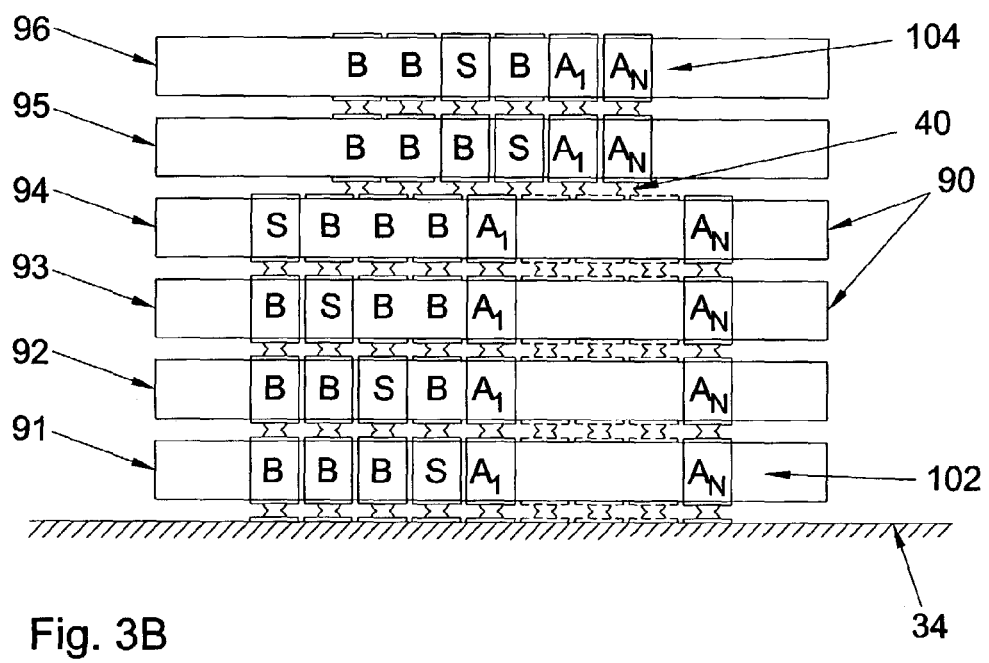
FIG. 3B shows a cross-sectional view of an alternative embodiment of a die design for stacking more than four dies.

FIG. 3B shows a side view of a possible pin arrangement for a die having more than four sets of bond pads per side, in order to accommodate stacking more than four dies. Six dies 90 are shown, distinguished by position, from bottom to top, with reference numerals 91, 92, 93, 94, 95 and 96, respectively. In order to facilitate such a configuration, a different set 100 of pads 70 is targeted by varying the interconnection pattern between the fourth and fifth dies, as designated from the bottom of the stack, for die configurations with four unique pad sets. For example, it can be seen in FIG. 3B that the pattern of interconnections 40 used for dies 91–94 is no longer needed for dies 95 and above since all four configurations of the outer set 102 have been used in rotation.

It will be understood that, in dies 95 and 96, outer set 102 is still present, but is not shown in the side view of FIG. 3B for the purposes of clarity. This first pattern of interconnections 40 between the pads of set 102 can be terminated at the fourth die, or die 94, and a new pattern can be used between the pads of set 104 connecting the fourth die 94 and every subsequent die (95 and 96). It will be understood that, although not shown, set 104 includes sufficient blank pads 72 to allow routing of dies above the fourth die (e.g., dies 95 and 96) through the first four dies (e.g., dies 91–94) to the substrate 34. Each die is designed and rotated in the stack such that only one die is paying attention to activated address lines.

Figure 4:
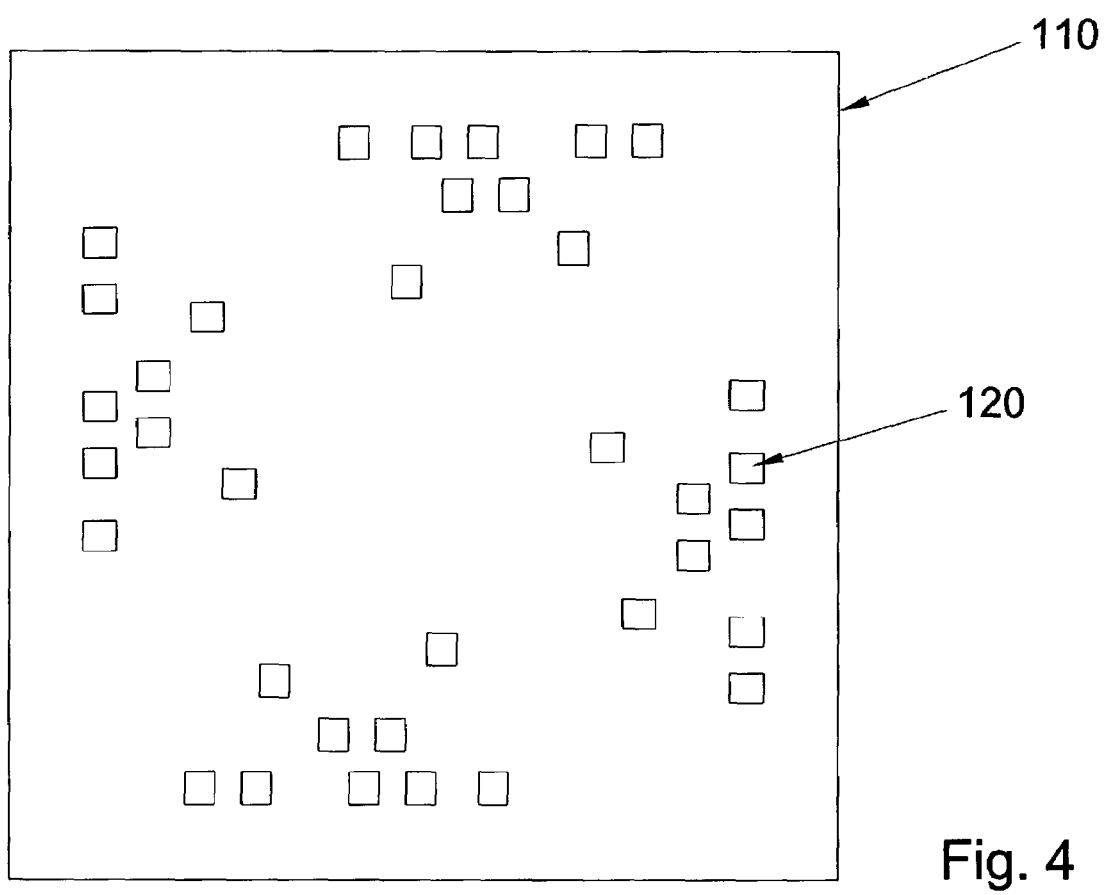
FIG. 4 shows a top view of a die having an alternative bond pad configuration.

It will also be understood that the bond pads do not have to conform to a conventional "ring" design, requiring placement on the perimeter of a die surface. As bumped dies often have interconnects on the area of a die surface, any routable configuration of bond pads may be used, without restriction to a certain geographic location on the die surface, as long as they are repeated as the die is rotated in 90-degree increments. This is illustrated in FIG. 4, a top view of a die 110 having a repeating pattern of bond pads 120, not arranged in a typical peripheral ring configuration, but repeating when rotated by 90-degree increments, nonetheless.

Dies will be attached to one another by known electrical interconnect method, including C4 ball attach, or other suitable method known in the art. In essence, all interconnected dies are working as one. For memory devices, this arrangement can allow customization of memory needs, as each additional die stacked can contribute more memory, allowing a degree of customization within the space used for one package. In addition to the benefits already mentioned, there is only one device to design, fabricate, test and assemble for use with a representative embodiment, which can potentially lead to supply chain benefits, more straightforward troubleshooting and yield management. Numerous variations and modifications will become apparent to those skilled in the art once the above disclosure is fully appreciated.

What is claimed is:

1. An electrical device, comprising:
   a first stackable die further comprising a plurality of sides;
   group of pads associated with each side in the plurality, wherein each pad passes through the first die, wherein each group of pads is in substantially the same relative position with respect to its associated side, wherein the pads in each group an arranged in a predetermined order according to their electrical connections; and
   a second stackable die that is substantially similar to the first die, wherein the second die is stacked on the first die such that a first group of pads on the first die couple to a second group of pads on the second die;
   wherein a first pad of the first group couples to a second pad in the second group and the first and second pads couple to different electrical connections.

2. The electrical device of claim 1, wherein rotating the first and second die with respect to each other results in different coupling arrangements.

3. The electrical device of claim 2, wherein the first and second groups each comprise at least two separate rows of pads.

4. The electrical device of claim 2, further comprising address pads and a select pad, wherein the address pads in the first group are in the same order as the address pads in the second group and wherein the select pad in the first group is in a different order than the select pad of the second group.

5. The electrical device of claim 2, wherein the first and second groups include address pads, and wherein the address pads in the first and second groups are coupled to each other.

6. The electrical device of claim 4, wherein the first and second groups further each include at least one select pad, and wherein the at least one select pad in the first group is insulated from the at least one select pad in the second group.

7. The electrical device of claim 4, wherein the first and second stackable dies are memory devices.

8. The electrical device of claim 4, wherein the first and second die completely overlap each other.

9. The electrical device of claim 2, wherein the first and second dies include an active areas, and the active areas of the first and second dies face in the same direction.

10. The electrical device of claim 2, wherein the electrical device operate differently depending on the rotation of the first and second dies with respect to each other.

11. The electrical device of claim 10, wherein each side in the plurality includes a select line and wherein the order of the select line is different for each side in the plurality.

12. A method for electrically interconnecting an electrical device, comprising:
    associating multiple groups of electrical connections with each side of a first die, wherein each group of electrical connections is in the same relative position with respect to its associated side, wherein the electrical connections pass through the die;
    arranging to electrical connections within each group such that at least two sides of the die have a different order of electrical connections;
    stacking an additional die upon the first die, wherein the additional die is substantially similar to the first die;
    coupling a first group of electrical connections on the first die to a second group of electrical connections on the additional die, and wherein the order of the electrical connections in the first group is different than the order of the electrical connections in the second group;
    rotating the first and second die with respect to each other to achieve different coupling arrangements; and
    orienting the additional die such that an active area of the additional die faces the same direction as an active area of the first die, wherein the arranging further comprises arranging the order of the electrical connections such that a set of address lines in the first group are in the same order as a set of address lines in the second group.

13. The method of claim 12, wherein each of the different coupling arrangements denote different operational states of the electrical device.

14. The method of claim 12, wherein stacking further comprises stacking the additional die upon the first die such that the additional die completely overlaps the first die.

15. The method of claim 12, wherein the arranging further comprises arranging the order of the electrical connections such that a select line in the first group is in a different order than a select line in the second group.

16. The method of claim 15, further comprising surrounding the first die and the additional die with an encapsulant.

17. A method for electrically interconnecting an electrical device, comprising;
associating multiple groups of electrical connections with each side of a first die, wherein each group of electrical connections is in the same relative position with respect to its associated side, wherein the electrical connections pass through the die;
arranging the electrical connections within each group such that at least two sides of the die have a different order of electrical connections;
stacking an additional die upon the first die, wherein the additional die is substantially similar to the first die;
coupling a first group of electrical connections on the first die to a second group of electrical connections on the additional die, and wherein the order of the electrical connections in the first group is different than the order of the electrical connections in the second group; and
rotating the first and second die with respect to each other to achieve different coupling arrangement, wherein the arranging further comprises arranging the groups of electrical connections into a first row including address lines and a second row including address lines, wherein there are fewer address lines in the second group than the first group.

* * * * *

UNITED STATES PATENT AND TRADEMARK OFFICE
CERTIFICATE OF CORRECTION

PATENT NO. : 7,098,541 B2  Page 1 of 1
APPLICATION NO. : 10/440815
DATED : August 29, 2006
INVENTOR(S) : Todd C. Adelmann It is certified that error appears in the above-identified patent and that said Letters Patent is hereby corrected as shown below:

In column 7, line 52, in Claim 1, insert -- a -- before "group".

In column 7, line 56, in Claim 1, delete "an" and insert -- are --, therefor.

In column 8, line 14, in Claim 6, delete "claim 4," and insert -- claim 5, --, therefor.

In column 8, line 19, in Claim 7, delete "claim 4," and insert -- claim 5, --, therefor.

In column 8, line 21, in Claim 8, delete "claim 4," and insert -- claim 5, --, therefor.

In column 8, line 24, in Claim 9, delete "areas," and insert -- area, --, therefor.

In column 8, line 27, in Claim 10, delete "operate" and insert -- operates --, therefor.

In column 8, line 40, in Claim 12, delete "to" and insert -- the --, therefor.

In column 9, line 4, in Claim 17, delete "comprising;" and insert -- comprising: --, therefor.

In column 10, line 7, in Claim 17, delete "arrangement," and insert -- arrangements, --, therefor.

Signed and Sealed this

Twenty-third Day of June, 2009

JOHN DOLL
*Acting Director of the United States Patent and Trademark Office*